(12) United States Patent
Holmes et al.

(10) Patent No.: US 7,229,889 B2
(45) Date of Patent: Jun. 12, 2007

(54) METHODS FOR METAL PLATING OF GATE CONDUCTORS AND SEMICONDUCTORS FORMED THEREBY

(75) Inventors: Steven J. Holmes, Guilderland, NY (US); Charles W. Koburger, III, Delmar, NY (US); David V. Horak, Essex Junction, VT (US); Toshiharu Furukawa, Essex Junction, VT (US); Mark C. Hakey, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,881

(22) Filed: Mar. 10, 2005

(65) Prior Publication Data
US 2006/0205123 A1 Sep. 14, 2006

(51) Int. Cl.
*H01L 21/20* (2006.01)
(52) U.S. Cl. .................. 438/396; 438/149; 438/588; 438/782; 438/780; 257/E21.415; 257/E21.442
(58) Field of Classification Search .................... None
See application file for complete search history.

(56) References Cited

U.S. PATENT DOCUMENTS

2003/0113970 A1* 6/2003 Fried et al. ................. 438/286

OTHER PUBLICATIONS

U.S. Appl. No. 10/906,876 Title: Methods For Providing Gate Conductors On Semiconductors And Semiconductors Formed Thereby Applicant(s): Holmes, et al. Filed: Mar. 10, 2005.

* cited by examiner

*Primary Examiner*—Michael Lebentritt
*Assistant Examiner*—Kyoung Lee
(74) *Attorney, Agent, or Firm*—Ohlandt, Greeley, Ruggiero & Perle, L.L.P.; Steven Capella, Esq.

(57) ABSTRACT

A method of metal plating a gate conductor on a semiconductor is provided. The method includes defining an organic polymer plating mandrel on the semiconductor, activating one or more sites of the organic polymer plating mandrel, and binding a seed layer to the one or more of the activated sites. A metallic conductive material can then be plated on the seed layer to form the gate conductor. Semiconductor devices having a gate conductor plated thereon to a width of between about 1 to about 7 nanometers are also provided.

17 Claims, 11 Drawing Sheets

METHODS FOR METAL PLATING OF GATE CONDUCTORS AND SEMICONDUCTORS FORMED THEREBY

CROSS REFERENCE TO RELATED APPLICATION

The present disclosure is related to U.S. application Ser. No. 10/906,876 filed Mar. 10, 2005, the contents of which are incorporated by reference herein.

BACKGROUND OF THE INVENTION

The present disclosure relates generally to the field of semiconductor manufacturing. More particularly, the present disclosure relates to methods for plating metal gate conductors on semiconductor devices and semiconductors formed thereby.

The continuing push for high performance and high density in the ultra large scale integrated circuits (ULSI) industry demands new device technologies to scale device dimension and new methods for manufacturing the new devices.

For example, the demand for increased device performance is particularly strong in the design and fabrication of field effect transistors (FET's). However, scaling FET's to attain higher device performance and density can increase the cost and difficulty of many manufacturing steps.

One type of FET that has been proven to provide increased device performance is a fin Field Effect Transistor ("finFET"). In a finFET, the body of the transistor is formed from a vertical structure, generally referred to as a "fin". The gate conductors of the finFET are then formed on one or more sides of the fin. Unfortunately, the formation of gate conductors on the vertical fin has proven increasingly difficult as the density of the finFET technology is increased. For example, the formation of gate conductors on the vertical fin requires specially-optimized lithography and etching to define the gate, which have proven difficult and/or expensive in many manufacturing processes.

Accordingly, it has been determined by the present disclosure that there is a need for methods of producing new semiconductor device features that overcome, mitigate, and/or avoid one or more of the aforementioned drawbacks and deficiencies of the prior art.

BRIEF DESCRIPTION OF THE INVENTION

Methods for plating metallic conductive gates on semiconductors are provided.

Semiconductor FET devices having plated metallic conductive gates are also provided.

In one embodiment, a method of metal plating a gate conductor on a semiconductor is provided. The method includes defining an organic polymer plating mandrel on the semiconductor, activating one or more sites of the organic polymer plating mandrel, and binding a seed layer to the one or more sites. A metallic conductive material can then be plated on the seed layer to define the gate conductor.

In other embodiments, a method of metal plating a gate conductor to a fin of a field effect transistor is provided. The method includes defining an organic polymer mandrel over the field effect transistor, activating a plurality of sites of the organic polymer mandrel, binding a plating seed layer to the plurality of sites, and plating a metallic material to the plating seed layer to define the gate conductor.

In still other embodiments, a field effect transistor is provided. The transistor includes a silicon dioxide layer, a silicon fin extending from the silicon dioxide layer in a substantially orthogonal direction, and a gate dielectric layer and a gate conductor on the silicon fin. The gate conductor has a width of between about 10 to about 70 nanometers.

The above-described and other features and advantages of the present disclosure will be appreciated and understood by those skilled in the art from the following detailed description, drawings, and appended claims.

BRIEF DESCRIPTION OF THE DRAWINGS

FIG. 12 is a top view of the fin structure after removal of the trim photoresist;

DETAILED DESCRIPTION OF THE INVENTION

An exemplary embodiment of a plating method according to the present disclosure is generally referred to herein by way of reference numeral 10. For purposes of clarity, method 10 is shown and described herein plating an electrically conductive gate ("gate conductor") extending outward from a vertical surface of fin Field Effect Transistor ("finFET").

Of course, it is contemplated by the present disclosure for method 10 to find use with other semiconductor devices such as, but not limited to, planar FET's and/or other planar or non-planar integrated circuit devices.

Advantageously, method 10 grows or plates the metallic gate conductor on the fin of the finFET. An exemplary embodiment of method 10 is illustrated schematically in FIG. 1. In a first step 110, method 10 defines a mandrel on a fin structure so that the mandrel extends in a direction substantially perpendicular to the fin. Method 10 then activates one or more sites of the mandrel in a second or activating step 120. Method 10 binds a plating seed layer to the active sites in a third or seeding step 130 and plates the metallic gate conductor on the seed layer in a fourth step 140. Once the metallic gate conductor is plated on the mandrel, method 10 then removes the mandrel in a fifth step 150, leaving the gate conductor in the desired location on the fin. After the gate conductor is formed, method 10 then implants source and drain dopants in the exposed silicon fin area in a sixth step 160. Next, method 10 encloses the gate conductor by a molding material and high temperature-anneal process during a seventh step 170.

Figure 1:
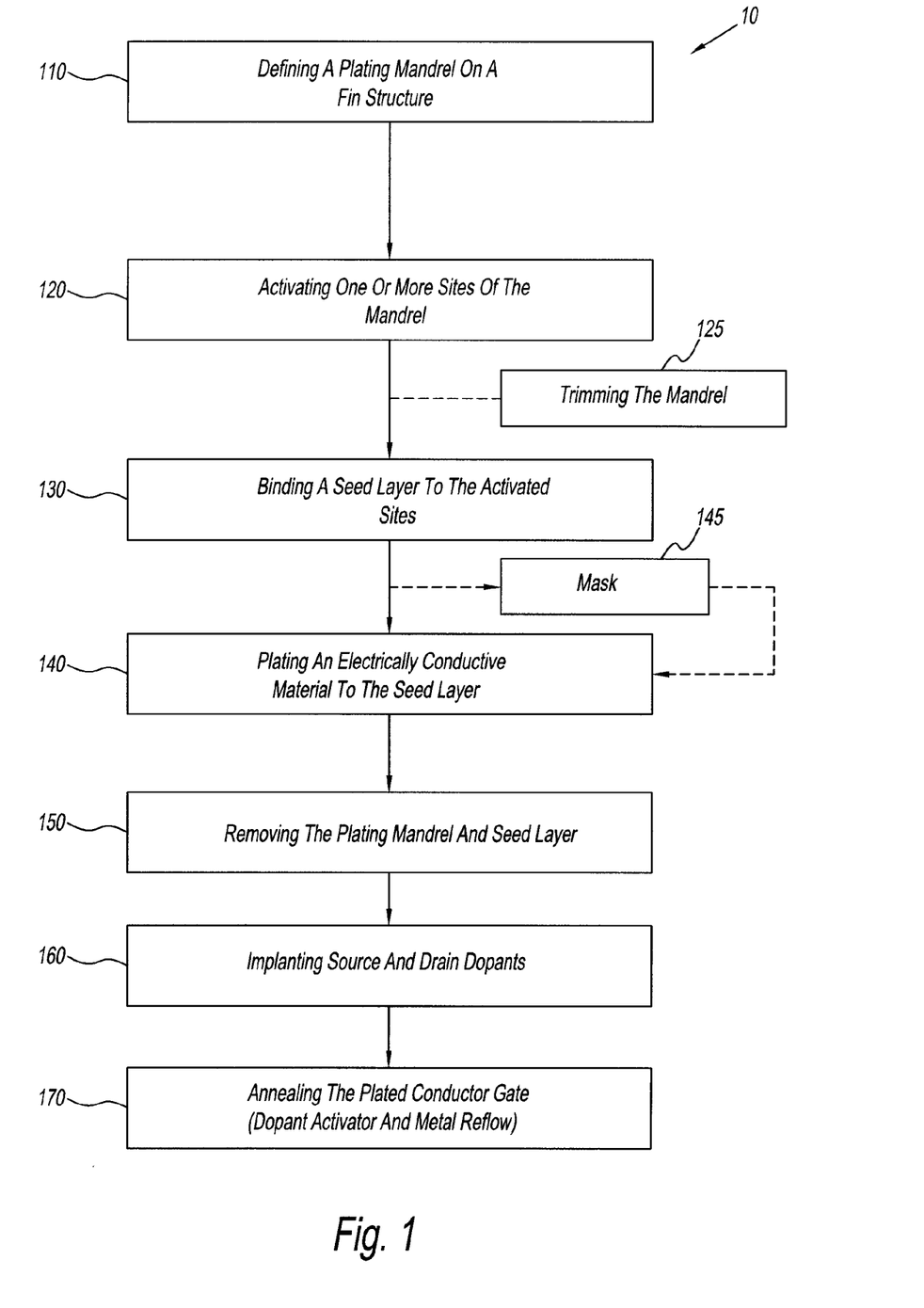
FIG. 1 is a schematic view of an exemplary embodiment of a plating method according to the present invention.

In some embodiments of the present disclosure, method 10 can include a trimming step 125, where the mandrel is trimmed after the activating step 120 but prior to the seeding step 130.

Method 10 provides gate conductors having a smaller width and a width that is better controlled than possible with prior non-plated gate conductors.

For example, method 10 can also provide gate conductors having a narrower width than possible with gate conductors formed by a conventional lithographic technique. For example, method 10 can plate a gate conductor line to a width of about 10 to about 70 nanometers (nm), preferably to a width of between about 30 to about 50 nm, and any sub-ranges therebetween.

In addition, method 10 can plate the gate conductor so that the width varies less than about 2 nm from a desired width. It is desired for all of the gate conductors on an integrated circuit device to have widths close to one another so that all of the devices perform at the same exact predicted speed (e.g., timing circuits). Accordingly, method 10 can provide integrated circuit of substantially high performance by providing multiple gate conductors that have widths that vary less than about 2 nm from each other, preferably less than about 1 nm.

The steps of plating method 10 are shown and described in further detail with sequential reference to FIGS. 2 through 21.

Figure 2:
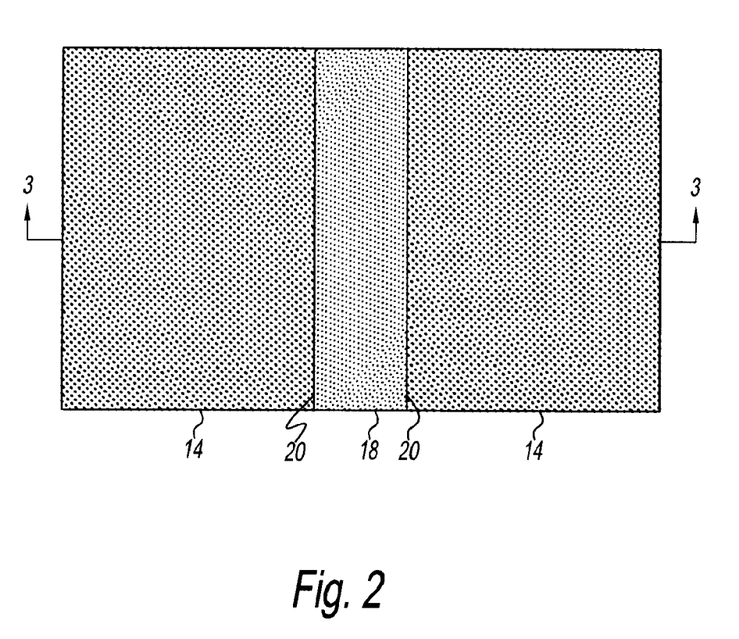
FIG. 2 is a top view of a fin structure prior to modification.
Figure 3:
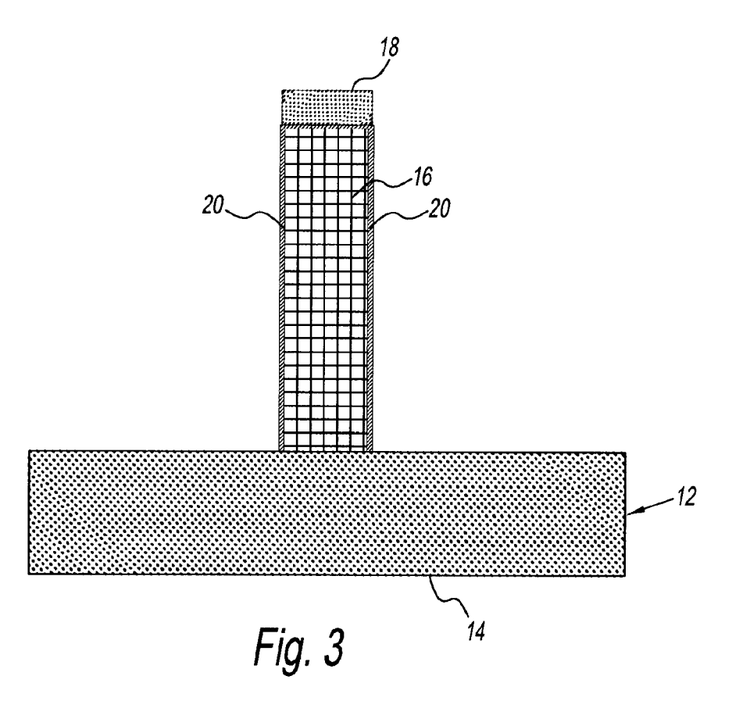
FIG. 3 is a sectional view of FIG. 2, taken along lines 3—3.

Beginning with FIGS. 2 and 3, a fin structure 12 prior to commencement of method 10 is shown. The fin structure 12 has a silicon dioxide layer 14, a silicon fin 16, and a silicon nitride mask 18. Fin 16 extends from silicon dioxide layer 14 in a substantially orthogonal direction. Mask 18 extends from an upper extent of fin 16 opposite silicon dioxide layer 14. The fin structure 12 can be etched using any conventional process for providing fins 16 on silicon dioxide layer 14. The fin structure 12 can also include a gate dielectric layer 20 on exposed surfaces of fin 16. Gate dielectric layer 20 can be grown thermally or deposited by chemical vapor deposition (CVD) on fin 16 using conventional processes.

Figure 4:
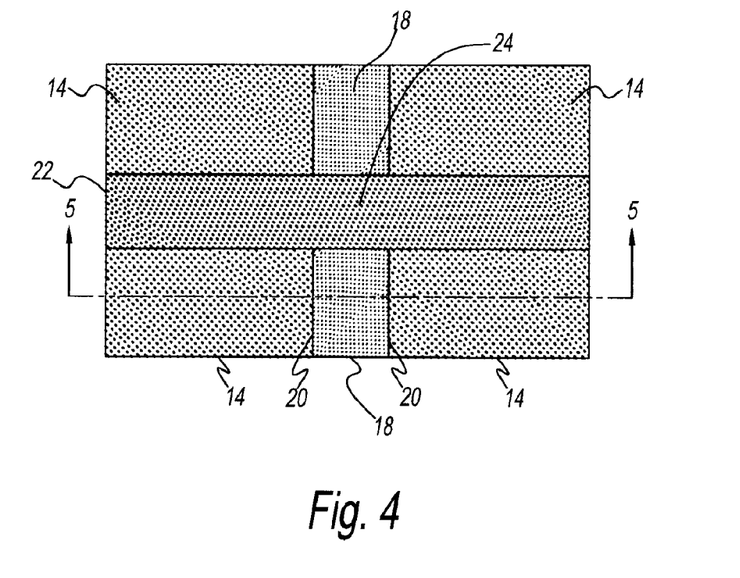
FIG. 4 is a top view of the fin structure after having an organic mandrel applied.
Figure 5:
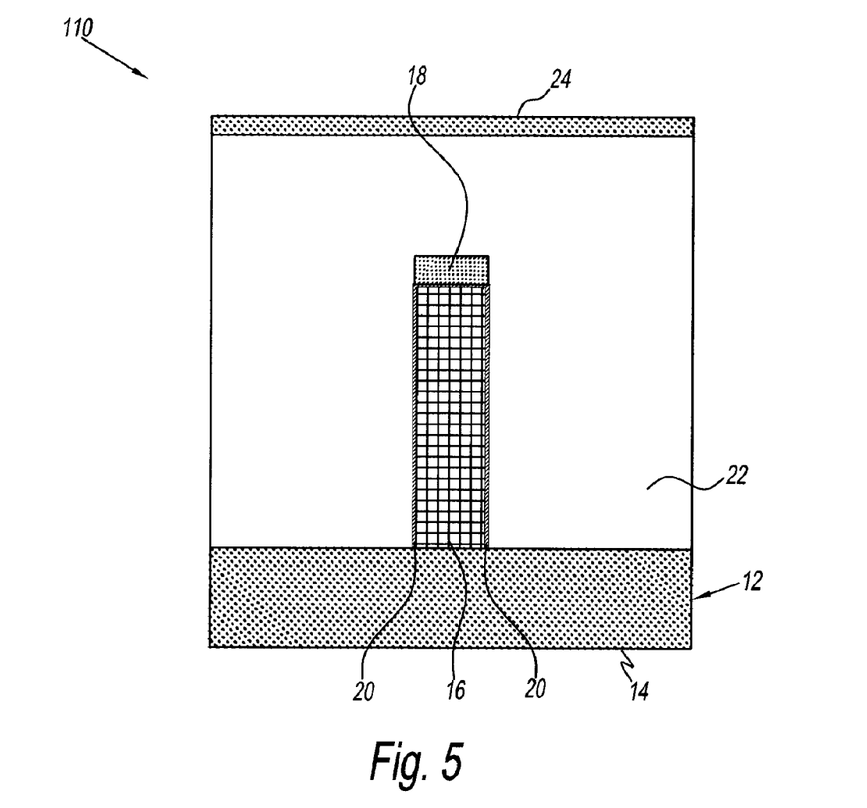
FIG. 5 is a sectional view of FIG. 4, taken along lines 5—5.

In first step 110, method 10 defines a mandrel 22 over silicon dioxide layer 14 and fin 16 as shown in FIGS. 4 and 5. Mandrel 22 is, preferably, made of an organic polymer such as, but not limited to maleic anhydride polymers, maleic anhydride copolymers, and other organic polymers.

In an exemplary embodiment, method 10 spin coats fin structure 12 with a solution of organic polymer and solvent and then bakes the coated fin structure to remove the solvent, leaving the baked mandrel material formed over silicon dioxide layer 14, fin 16, mask 18, and gate dielectric layer 20. Once the baked mandrel material is formed on fin structure 12, method 10 then deposits a cap layer 24 on top of the baked mandrel material. Cap layer 24 can be formed of a silicon dioxide material deposited using any known technique such as, but not limited to, a spin-application process, or plasma assisted CVD.

Method 10 then etches one or more portions of cap layer 24 and the baked mandrel material to define mandrel 22. In the illustrated embodiment, mandrel 22 is defined substantially orthogonal to silicon dioxide layer 14 and fin 16. Advantageously, mandrel 22 assists method 10 in plating a gate conductor on fin 16 as described in detail below.

Figure 6:
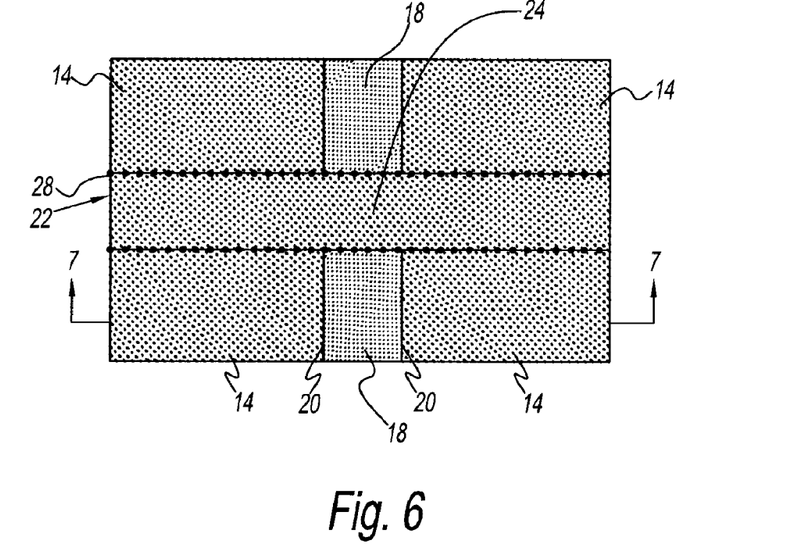
FIG. 6 is a top view of the fin structure after activation of the organic mandrel.
Figure 7:
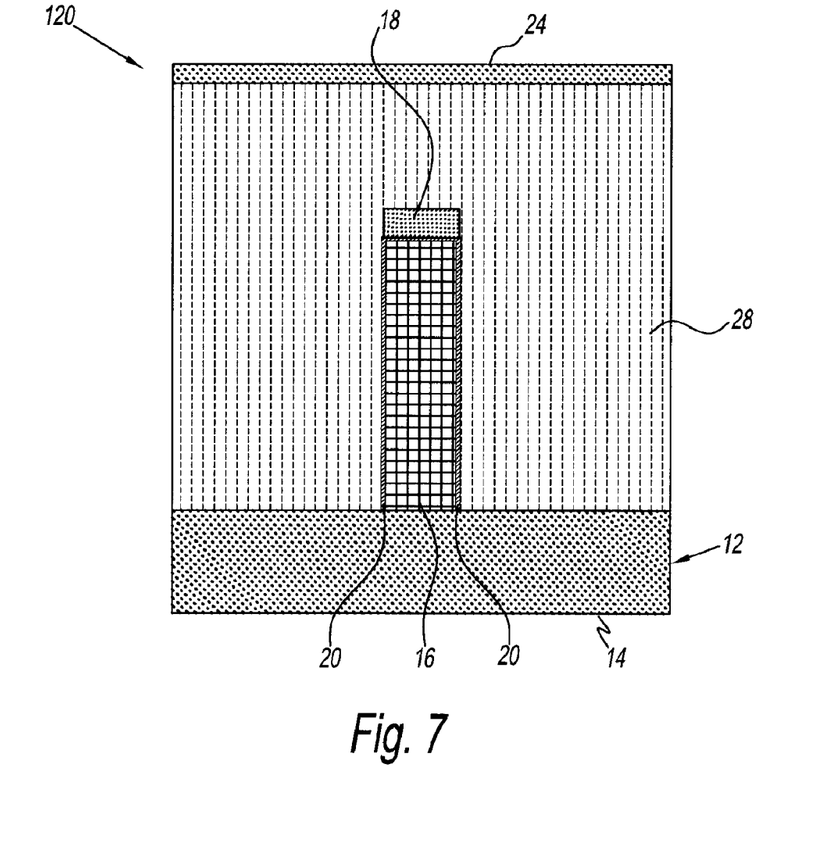
FIG. 7 is a sectional view of FIG. 6, taken along lines 7—7.

In second step 120, method 10 activates the organic polymer of mandrel 22 to provide a plurality of active sites 28 as illustrated in FIGS. 6 and 7. As used herein the term "active site" shall mean a site of the organic polymer of mandrel 22 that has been treated so that that site is receptive to bind metallic ions from the aqueous solution of a metallic salt. It is contemplated by the present disclosure for active sites 28 to be defined by known methods. For example, mandrel 22 can be treated with ammonia plasma to create amine reactive sites 28 on the organic polymer. In another example, mandrel 22 can be treated with oxygen plasma, or sulfuric acid, or peroxide wet acid to create carboxylic acid functional sites 28 on the organic polymer. In yet another example, mandrel 22 can be treated with amines or polyfunctional amines, as a vapor or in a solution.

Figure 8:
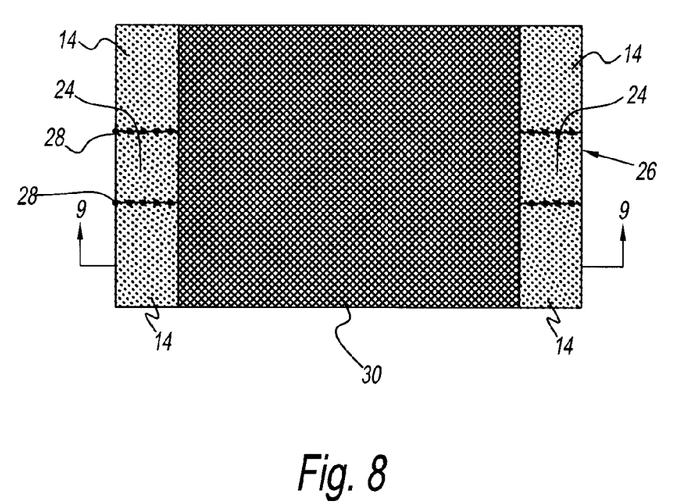
FIG. 8 is a top view of the fin structure after a photoresist is applied, exposed and developed.
Figure 9:
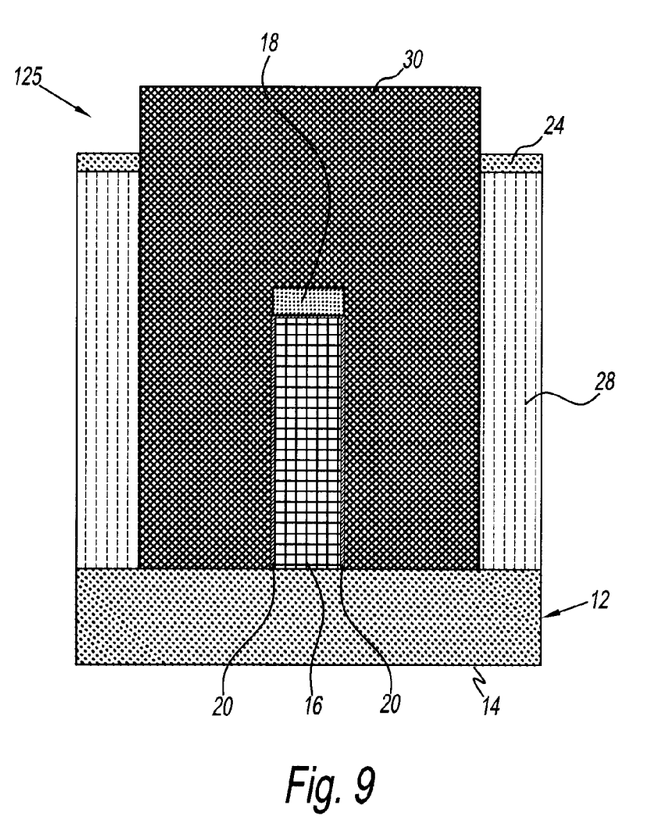
FIG. 9 is a sectional view of FIG. 8, taken along lines 9—9.
Figure 10:
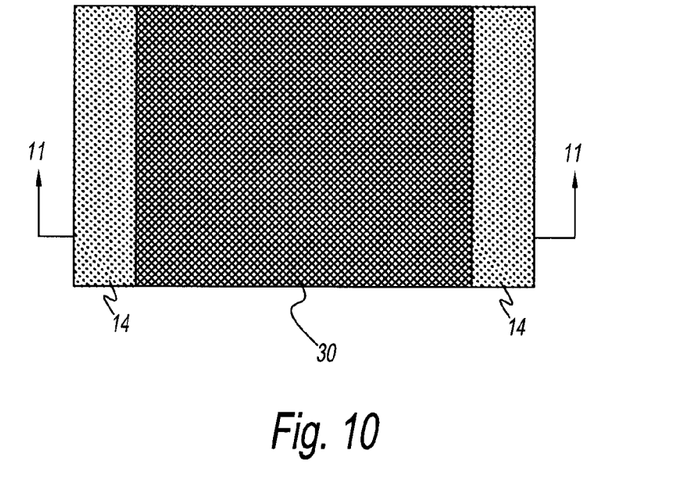
FIG. 10 is a top view of the fin structure after trimming of the organic mandrel.
Figure 11:
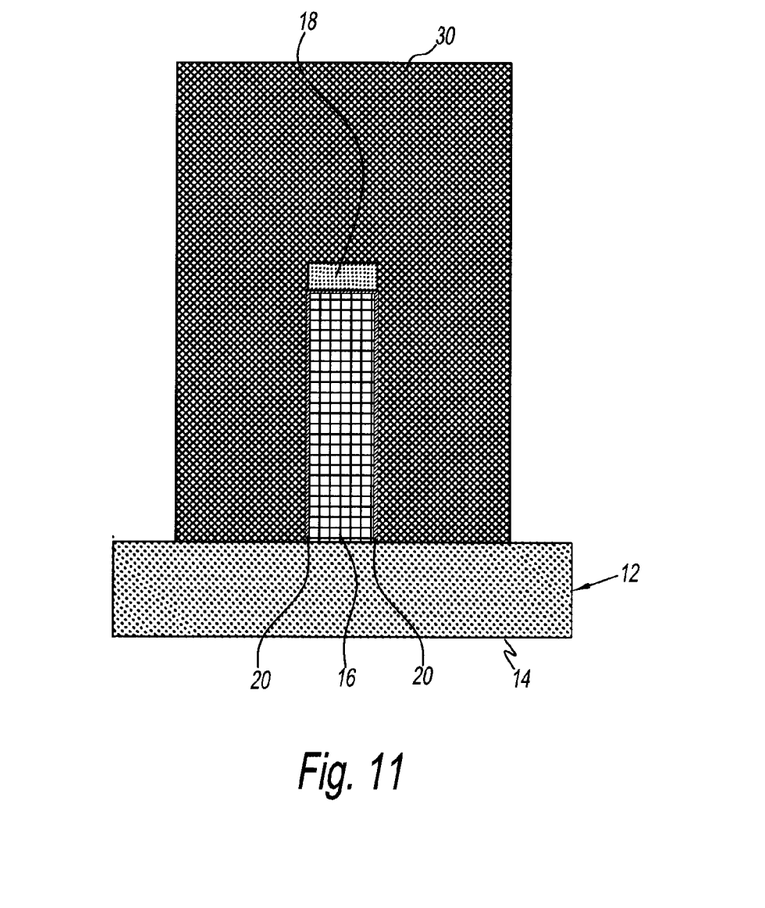
FIG. 11 is a sectional view of FIG. 10, taken along lines 11—11.
Figure 13:
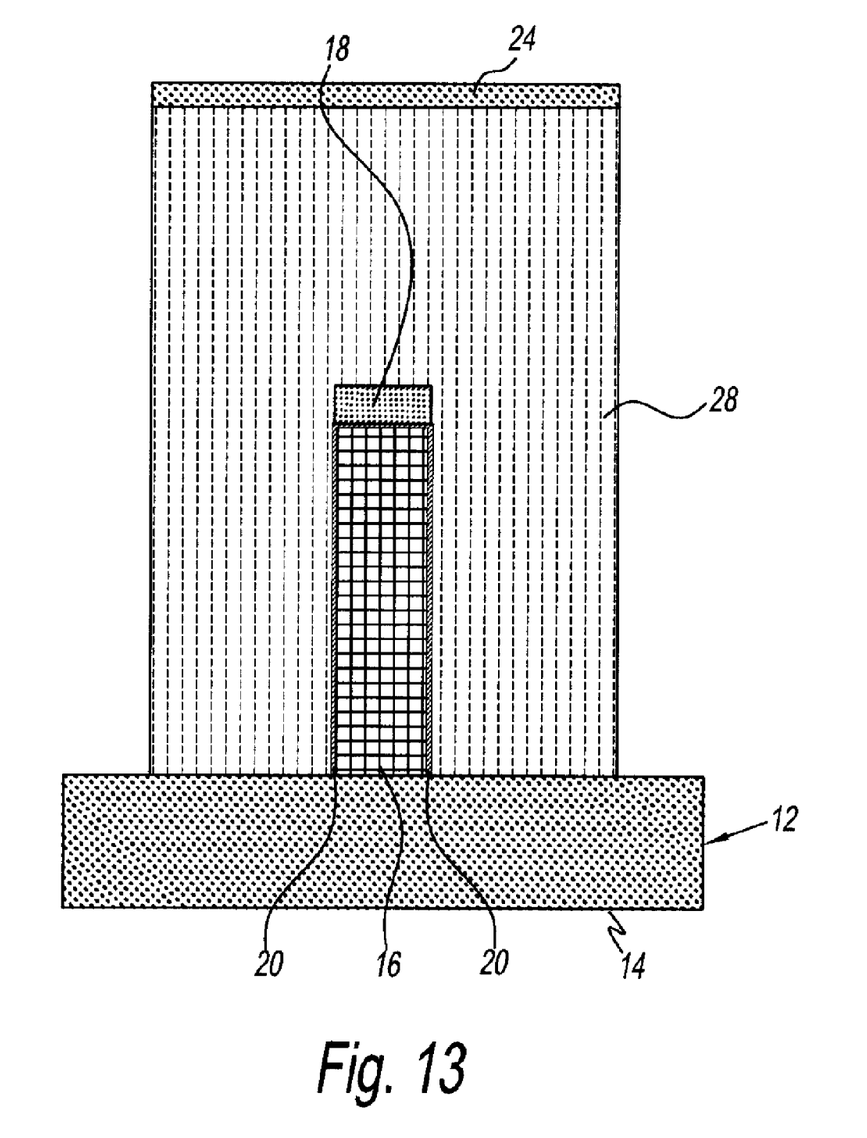
FIG. 13 is a sectional view of FIG. 12, taken along lines 13—13.

In some embodiments of the present disclosure, method 10 can include trimming step 125 shown in FIGS. 8 through 13 to trim mandrel 22 to a desired shape using, for example, known photolithography techniques. For example, method 10 can form a photoresist pattern 30 on one or more desired locations of fin structure 12 as shown in FIGS. 8 and 9. Method 10 then exposes fin structure 12 so that those portions of mandrel 22 that are not covered with photoresist 30 are removed by etching as shown in FIGS. 10 and 11. Next, method 10 removes photoresist 30 to leave a trimmed mandrel 32 as seen in FIGS. 12 and 13.

In this embodiment having trimming step 125, trimmed mandrel 32 now includes one or more surfaces 34 that lack activated sites 28. In the illustrated embodiment, surfaces 34 are shown at the terminal or outer ends of trimmed mandrel 32. However, it is also contemplated by the present disclosure for surfaces 34 to be positioned at the side surface and/or upper surfaces of trimmed mandrel 32.

Figure 14:
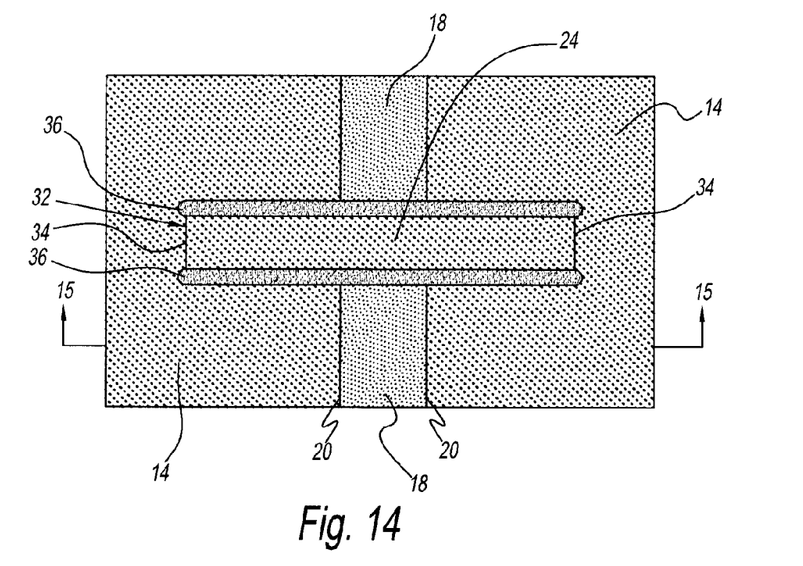
FIG. 14 is a top view of the fin structure after forming a seed layer onto active sites of the mandrel.
Figure 15:
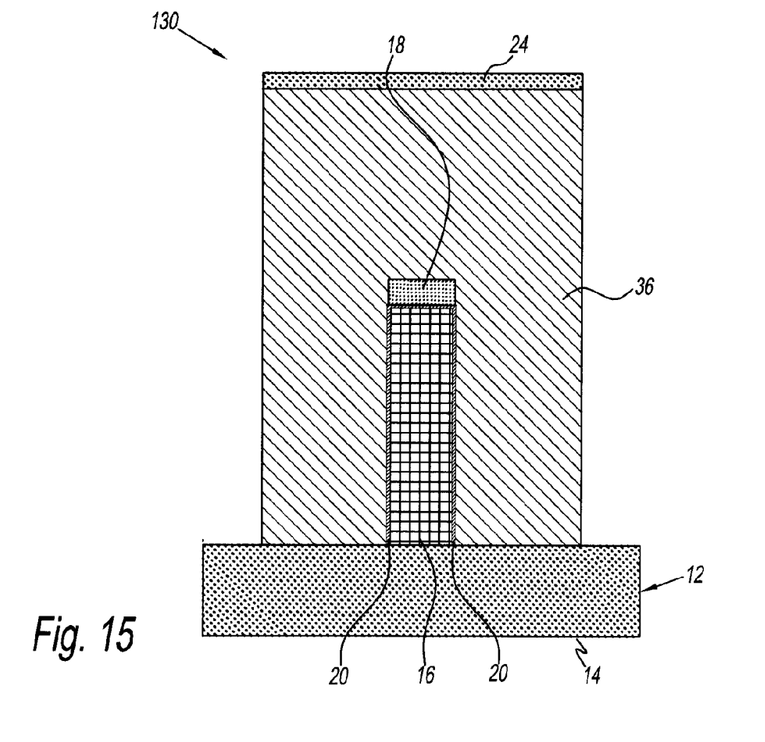
FIG. 15 is a sectional view of FIG. 14, taken along lines 15—15.

Method 10 then binds a plating seed layer 36 to sites 28 of trimmed mandrel 32 during third or seeding step 130 as shown in FIGS. 14 and 15. In one exemplary embodiment of seeding step 130, method 10 can dip fin structure 12 in an aqueous platinum chloride solution so that the platinum species bind to amine reactive sites 28 on the organic polymer of trimmed mandrel 32. Here, seed layer 36 is not bound on surfaces 34 or cap layer 24 as these surfaces lack activated sites 28 as discussed above. In the illustrated embodiment, method 10 defines one seed layer 36 on each of the two side surfaces of trimmed mandrel 32.

Method 10 can then reduce the metal ions present in seed layer 36 to a metallic seed layer. Method 10 can reduce seed layer 36 using any known reduction process. For example, where seed layer 36 is bound using an aqueous platinum chloride solution bound to amine reactive sites 28, method 10 can reduce the seed layer by exposing fin structure 12 to hydrogen gas at a temperature of about 25 degrees Celsius for about 1 minute to 30 minutes.

Figure 16:
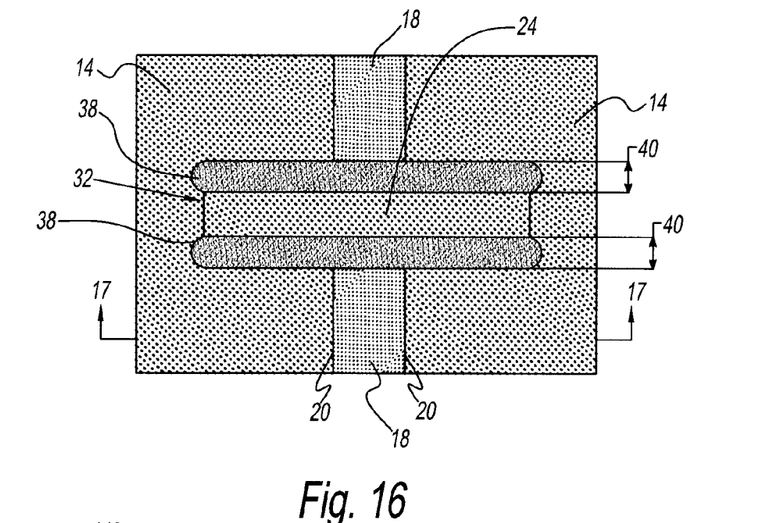
FIG. 16 is a top view of the fin structure after plating a gate conductor on the seed layer.
Figure 17:
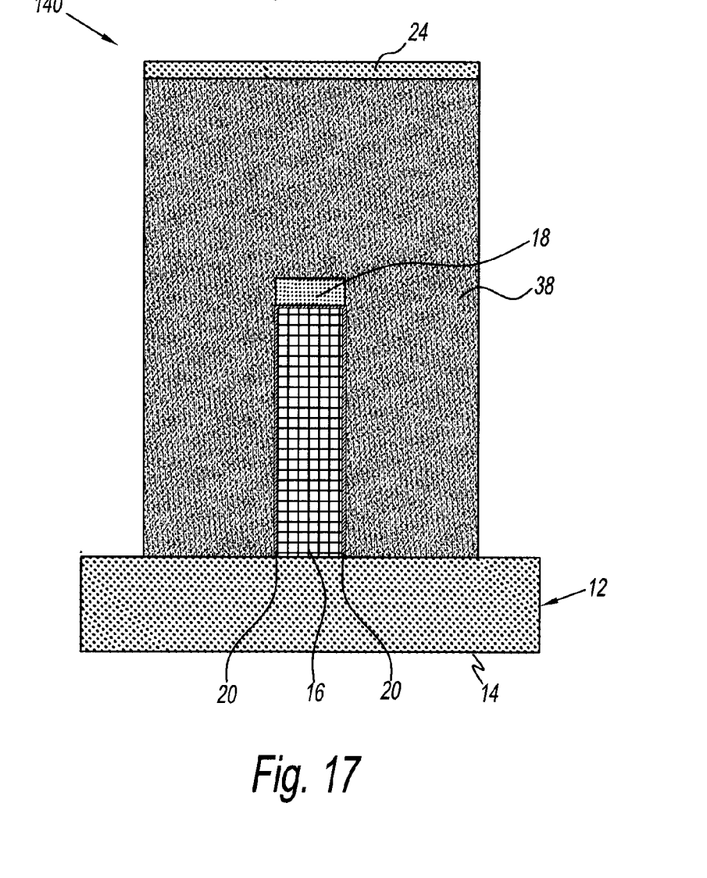
FIG. 17 is a sectional view of FIG. 16, taken along lines 17—17.

Referring now to FIGS. 16 and 17, method 10 includes fourth or plating step 140 where a gate conductor 38 is plated on seed layer 36 using known selective plating techniques. The choice of metal that is plated on seed layer 36 to form gate conductor 38 is dependent, at least in part, on the desired function of fin structure 12. By way of example, gate conductor 38 can be formed of a metal such as, but not limited to cobalt, rhodium, palladium, ruthenium, iridium, platinum, rhenium, or any combinations and/or alloys thereof.

Method 10 can also include one or more masking steps 145 for masking seed layer 36 in conjunction with the plating of gate conductor 38 to the seed layer. In this manner, the masking 145 and plating 140 steps can be repeated as needed to provide fin structure 12 with gate conductor 38 having different metals, for example, for PFET and NFET.

Advantageously, method 10 plates gate conductor 38 to a width that is narrower and better controlled than possible with gate conductors defined by conventional lithography and etching processes. For example, method 10 can plate two or more gate conductors 38 having a width 40 of about 10 to about 70 nm where the widths of the gate conductors vary less than about 1 to about 2 nm from each other.

Figure 18:
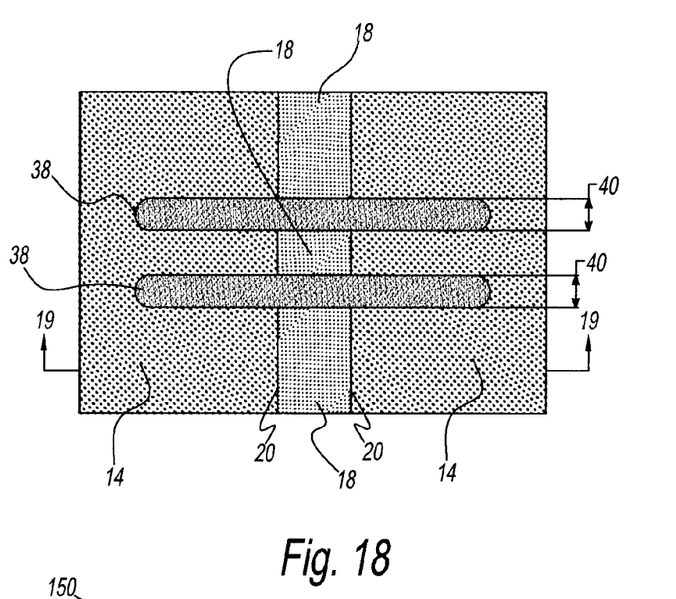
FIG. 18 is a top view of the fin structure after removal of the mandrel.
Figure 19:
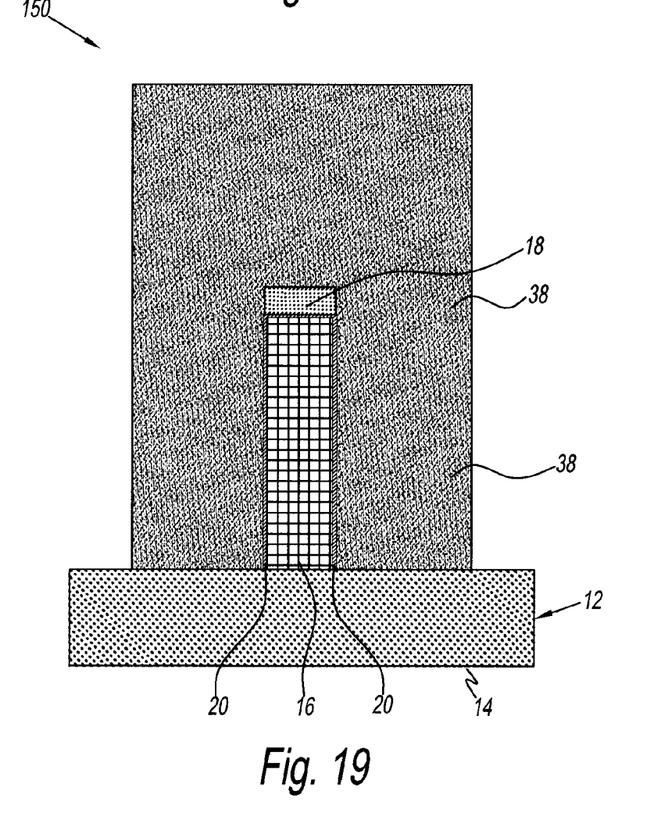
FIG. 19 is a sectional view of FIG. 18, taken along lines 19—19.

Method 10 can then strip cap layer 24 and trimmed mandrel 32 during fifth or removing step 150 to leave fin structure 12 with gate conductors 38 as seen in FIGS. 18 and 19. In the illustrated embodiment, fin 16 extends from silicon dioxide layer 14 in a substantially orthogonal direction. Similarly, gate conductors 38 extend from fin 16 and silicon dioxide layer 14 in a substantially orthogonal direction. Of course, it is contemplated by the present disclosure for method 10 to directly plate gate conductor 38 having any desired orientation with respect to silicon dioxide layer 14 and/or fin 16.

Once method 10 has removed trimmed mandrel 32 from fin structure 12, the fin structure can be further processed into any desired device such as, but not limited to, a NFET and a PFET. For example, source and drain regions 44 (shown in FIG. 21) can be implanted by angled ion implantations with an appropriate photo resist mask to block the opposite polarity device area in sixth step 160.

Figure 20:
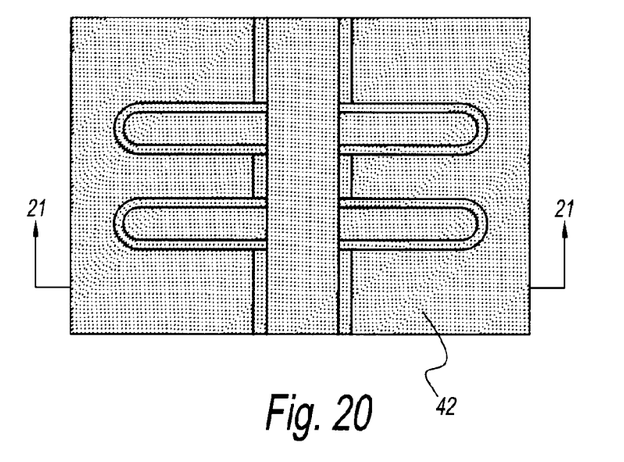
FIG. 20 is a top view of the fin structure after forming a mold for annealing the gate conductor.
Figure 21:
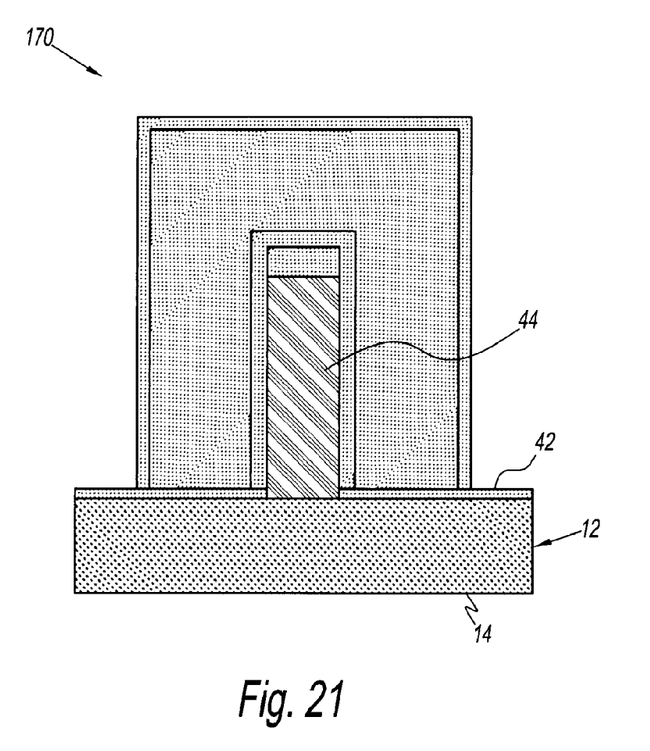
FIG. 21 is a sectional view of FIG. 20, taken along lines 21—21.

Method 10 includes seventh or annealing step 170 shown in FIGS. 20 through 21 to activate dopants in source and drain. For example, fin structures can be annealed using a laser annealing process or a rapid thermal anneal at a temperature between 900 C. and 1150 C. for a range of 10 micro seconds to a 10 seconds.

Depending on the materials of gate conductor 38 the anneal temperature in step 170 may be sufficient to melt the gate conductor. Thus, some embodiments of method 10 encase fin structure 12 in a mold 42 as part of annealing step 160 as shown in FIGS. 20 and 21. Mold 42 can be formed of materials sufficient to withstand the conditions (e.g., temperature) of annealing step 160 while maintaining gate conductor 38 in its desired shape. For example, method 10 can encase fin structure 12 with a nitride mold 42. After annealing, some or all of mold 42 can be etched away from fin structure 12. In some embodiments, a portion (not shown) of mold 42 can be left about gate conductor 38 to enhance the structural stability of the gate.

After fifth step 150, well known process steps can be used to form contacts, wirings, passivation, and the like to complete the ULSI chip manufacturing.

It should be recognized that the present disclosure is described above with respect to FIGS. 2 through 21 by example where the mandrel has two surfaces with active sites 28 such that the illustrated embodiment results in the formation of two gate conductors 38. Of course, it is contemplated by the present disclosure for the mandrel to have a single surface of activated site 28 such that a single gate conductor is formed.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A method of metal plating a gate conductor on a semiconductor, comprising:
   defining an organic polymer plating mandrel on the semiconductor;
   activating one or more sites of said organic polymer plating mandrel;
   binding a seed layer to said one or more sites; and
   plating a metallic conductive material to said seed layer to form the gate conductor.

2. The method of claim 1, further comprising removing said organic polymer plating mandrel from the semiconductor.

3. The method of claim 1, further comprising trimming said organic polymer plating mandrel after activating the one or more sites.

4. The method of claim 1, wherein the semiconductor is single crystal silicon, silicon germanium or germanium.

5. The method of claim 1, further comprising annealing said metallic conductive material.

6. A method of metal plating a gate conductor to a fin structure, comprising:
   defining an organic polymer mandrel over the fin structure;
   activating a plurality of sites of said organic polymer mandrel;
   binding a plating seed layer to said plurality of sites; and
   plating a metallic material on said plating seed layer, said metallic material for forming the gate conductor.

7. The method of claim 6, wherein defining the organic polymer mandrel comprises spin coating the fin structure with a solution of organic polymer and solvent and baking the coated fin structure to remove the solvent.

8. The method of claim 6, further comprising etching said organic polymer mandrel prior to activating said plurality of sites.

9. The method of claim 6, wherein activating the plurality of sites comprises treating said organic polymer mandrel with an agent selected from the group consisting of ammonia plasma, oxygen plasma, sulfuric acid, peroxide wet acid, amine, and polyfunctional amine.

10. The method of claim 6, further comprising trimming said organic polymer mandrel after activating said plurality of sites.

11. The method of claim 10, wherein trimming said organic polymer mandrel after activating said plurality of sites defines one or more portions lacking said plurality of sites.

12. The method of claim 6, wherein said plurality of sites comprise a plurality of amine reactive sites and wherein binding said plating seed layer comprises dipping the fin structure in an aqueous platinum chloride solution and exposing the fin structure to hydrogen gas so that platinum ions in said aqueous platinum chloride solution bind to said plurality of amine reactive sites.

13. The method of claim 6, wherein said metallic material is selected from the group consisting of cobalt, rhodium, palladium, ruthenium, iridium, platinum, rhenium, and any combinations and/or alloys thereof.

14. The method of claim 6, further comprising annealing said fin structure.

15. The method of claim 6, further comprising encasing at least the gate conductor in a mold prior to annealing said metallic material and removing at least a portion of said mold.

16. The method of claim 6, further comprising masking the fin structure and repeating said plating of said metallic material to said plating seed layer so that said metallic material forms the gate conductor having at least two different metals.

17. A method of metal plating a gate conductor, comprising:
    defining an organic polymer mandrel;
    activating a plurality of sites of said organic polymer mandrel;
    binding a plating seed layer to said plurality of sites; and
    plating a metallic material on said plating seed layer.

* * * * *